United States Patent
Mandelman et al.

(10) Patent No.: US 6,437,401 B1
(45) Date of Patent: Aug. 20, 2002

(54) STRUCTURE AND METHOD FOR IMPROVED ISOLATION IN TRENCH STORAGE CELLS

(75) Inventors: Jack A. Mandelman, Stormville; Stephan Kudelka; Andreas Knorr, both of Fishkill; Stephen Rahn, LaGrangeville; Helmut Tews, Poughkeepsie; Michael Wise, Lagrangeville, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/824,957

(22) Filed: Apr. 3, 2001

(51) Int. Cl.[7] .......................... H01L 29/76; H01L 29/94
(52) U.S. Cl. ..................... 257/330; 257/331; 257/328
(58) Field of Search .............................. 257/330, 331, 257/328

(56) References Cited

U.S. PATENT DOCUMENTS 5,670,803 A * 9/1997 Beilstein, Jr. et al.
6,049,105 A * 4/2000 Krautschneider et al.
6,153,902 A * 11/2000 Furukawa et al.
6,163,045 A * 12/2000 Mandelman et al.
6,339,241 B1 * 1/2002 Mandelmann et al.

OTHER PUBLICATIONS

Article entitled A 0.6um 256 MB Trench DRAM Cell With Self–Aligned BuriED STrap (BEST), by L. Nesbit et al, IEDM 1993, pp. 627–630.

* cited by examiner

Primary Examiner—Stephen D. Meier
(74) Attorney, Agent, or Firm—Irwin Ostroff (57) ABSTRACT

A trench capacitor structure for improved charge retention and method of manufacturing thereof are provided. A trench is formed in a p-type conductivity semiconductor substrate. An isolation collar is located in an upper portion of the trench. The substrate adjacent the upper portion of the trench contains a first n+ type conductivity region and a second n+ type conductivity region. These regions each abut a wall of the trench and are separated vertically by a portion of the p-type conductivity semiconductor substrate. A void which encircles the perimeter of the trench is formed into the wall of the trench and is located in the substrate between the first and second n+ type conductivity regions.

24 Claims, 10 Drawing Sheets

STRUCTURE AND METHOD FOR IMPROVED ISOLATION IN TRENCH STORAGE CELLS

Field of the Invention

This invention generally relates to device and device fabrication and, more particularly, to transistor-trench capacitor memory cells.

BACKGROUND OF THE INVENTION

Integrated circuits (ICs) employ capacitors for the storage of charge. The presence or absence of stored charge, its charge storage state, defines information contained within capacitors in ICs. For example, memory devices, including random access memories (RAMs), such as dynamic RAMs (DRAMs), store charge in capacitors; the relative quantity of charge in the capacitor is commonly used to represent a bit of data ("0" or "1").

A DRAM IC includes an array of memory cells interconnected by rows and columns of conductive lines. The rows and columns of conductive lines are typically referred to as wordlines and bitlines, respectively. Cells in the memory array may be randomly accessed, for reading or writing bits of data, by activating appropriate wordlines and bitlines.

A DRAM memory cell typically includes an access transistor that is connected serially with a storage capacitor. Typically, the access transistor of a DRAM memory cell consists of a metal-oxide-semiconductor field effect transistor (MOSFET). The MOSFET includes a semiconductor body (substrate) of a first conductivity type and first and second regions of the opposite conductivity type which are separated by a portion of the substrate which is covered by a gate conductor that is separated from the surface of the substrate by a dielectric layer. The first and second regions are referred to as bitline and storage node diffusion (also commonly referred to as the buried-strap outdiffusion) regions or first and second input/output region, and comprise the drain and source regions of the MOSFET. The diffusion region which serves as the drain or source depends upon the operation of the transistor within the memory cell (i.e., write "1", write "0", read "1", read "0", data refresh). For each memory cell, the gate of the MOSFET is connected to a wordline conductor, the bitline diffusion is connected to the bitline conductor, and the storage node diffusion is connected to the storage capacitor. Application of a voltage to the wordline (active state) switches MOSFETs connected to that wordline to the on-state (conductive), allowing the exchange of charge between the bitline and the storage capacitor. When the MOSFET is in the on-state memory cell operations such as write "1", write "0", read "1", read "0", and data refresh may be performed. MOSFETs connected to wordlines which are inactive are in the off-state (non-conductive). In the off-state the MOSFET isolates the storage capacitor from the bitline. This allows charge stored in the capacitor, which represents a stored logic "1" or "0", to be retained for a useful period of time.

Trench capacitors are commonly used as storage elements in DRAMs. A trench capacitor is a three-dimensional structure formed into a semiconductor substrate. A conventional trench capacitor comprises a trench etched into a silicon substrate. The trench is typically lined with an insulating material that serves as the dielectric of the storage capacitor. A first electrode of the storage capacitor consists of a conductive material, typically n+ type doped polysilicon, which fills a portion of the trench. The first electrode is typically referred to as the capacitor node. A second electrode of the storage capacitor, the capacitor plate (or counter-electrode), is formed by a diffused region adjacent a lower portion of the trench sidewall. The diffused plate electrode (also commonly referred to as the buried-plate diffusion) is typically formed by outdiffusing n+ type dopant, from a dopant source within the trench, into the p-type doped substrate surrounding a lower portion of the trench, and is commonly referred to as the buried-plate electrode. To assure an adequate time of retention of data ("0" or "1") stored in the capacitor when the MOSFET of the memory cell is in the off-state, leakage current to and from the capacitor node must typically be less than 1fA/cell.

Figure 1:
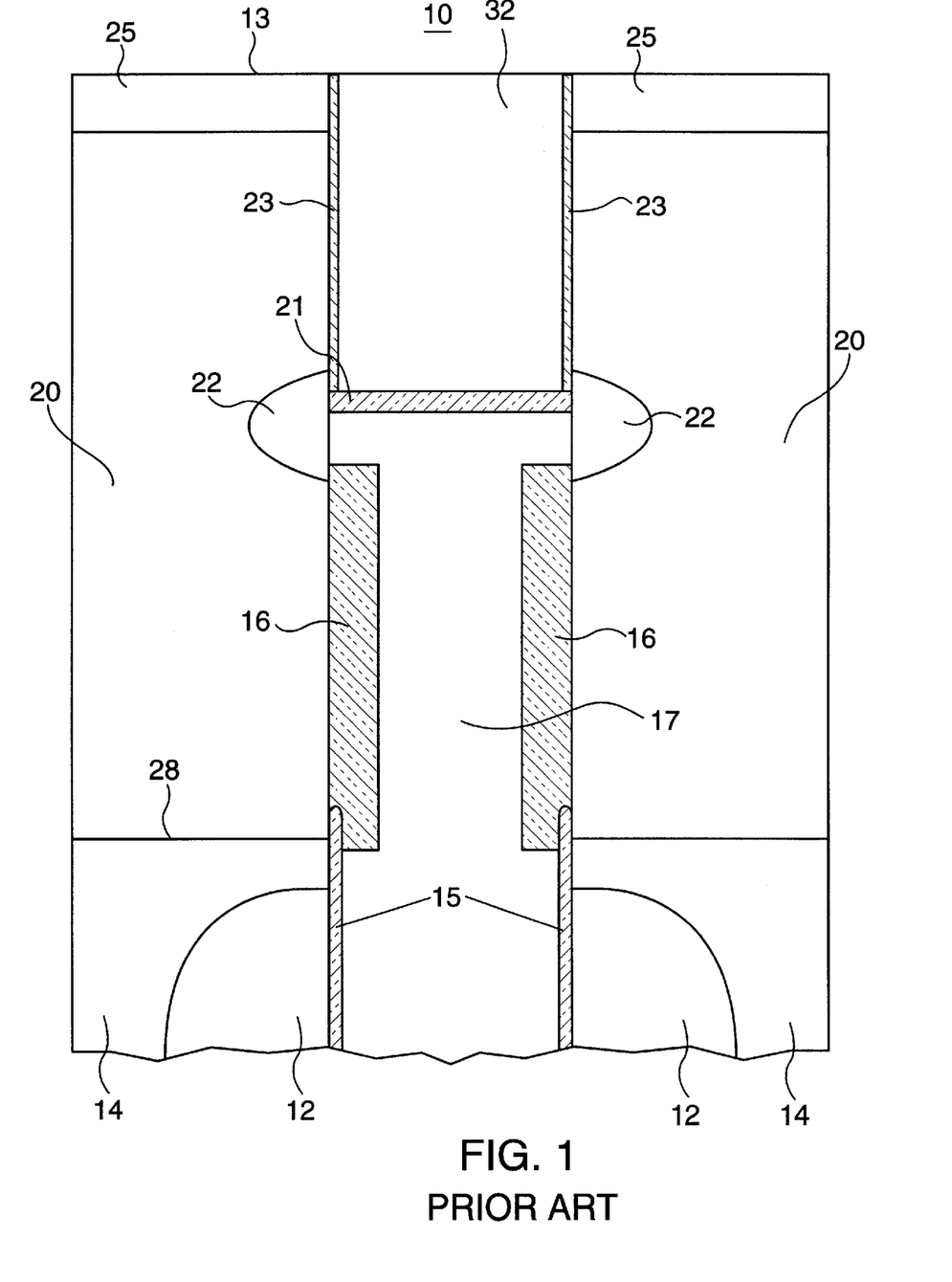
FIG. 1 shows a cross-section view of a prior art transistor-trench capacitor memory cell.

FIG. 1 shows a prior art vertical MOSFET-trench capacitor DRAM cell including a vertical access MOSFET having a gate conductor 32, a bitline diffusion (a first input/output region) 25, and a storage node diffusion (a second input/output region) 22 formed in a semiconductor body (substrate) 20 having a top surface 13. The vertical MOSFET overlies a storage capacitor within the trench. Storage node diffusion 22 is electrically connected to a storage capacitor consisting of a storage capacitor node electrode 17 (typically of n+ type doped polysilicon), a capacitor dielectric 15 layer (typically a silicon nitride/silicon oxide sandwich), and a buried-plate diffusion electrode 12 (typically an n+ type doped pocket in a p-type doped region of a monocrystalline silicon substrate). A junction between the p-type doped substrate region (also referred to as the array p-well) 20 and a band of n-type dopant 14 is denoted by 28. The band of n-type dopant 14 serves to isolate the p-type doped substrate region of the cell from other circuit elements on the chip. Leakage of charge to and from storage capacitor node electrode 17 may result from a variety of mechanisms. Sub-threshold conduction between bitline diffusion 25 and storage node diffusion 22 of the MOSFET, storage node diffusion 22 leakage to substrate 20, and parasitic MOSFET action between storage node diffusion 22 and buried-plate diffusion electrode 12 are mechanisms that typically contribute to leakage resulting in loss of stored data. Sub-threshold leakage may be limited by appropriate choice of threshold voltage of the MOSFET. Storage node diffusion 22 to substrate 20 leakage may be controlled by methods such as limiting the maximum substrate doping concentration adjacent to storage node diffusion 22 and appropriate anneal conditions during fabrication. However, as the dimensions of the DRAM cell are scaled down, control of the parasitic MOSFET action between storage node diffusion 22 and buried-plate diffusion electrode 12 becomes increasingly problematic.

To limit parasitic MOSFET leakage between storage node diffusion 22 and buried-plate diffusion electrode 12 to an acceptable level, an isolation collar 16, typically of silicon oxide, is provided therein on a sidewall of the trench between storage node diffusion 22 and buried-plate diffusion electrode 12. The parasitic MOSFET comprises source/drain diffusions consisting of storage node diffusion 22 and buried-plate diffusion 12, with the gate conductor of the parasitic MOSFET being storage capacitor node electrode 17. Isolation collar 16 is the equivalent gate dielectric of the parasitic MOSFET. By increasing the thickness of the isolation collar 16, the threshold voltage of the parasitic MOSFET may be increased, reducing its off-state leakage current. Typically, an isolation collar thickness of between approximately 25–70 nm is required to reduce the parasitic leakage current to 1fA/cell or less.

Continued demand for DRAM with ever increasing density of bits/chip requires that the design groundrules be aggressively reduced. For example, design rules have been scaled from 0.25 microns ($\mu$m) down to below 0.12 $\mu$m. The shortest dimension for the opening of the storage trench is typically approximately equal to the design rule. At a design rule of 0.25 $\mu$m there is ample room within the trench to form an isolation collar 16 as thick as 70 nm and still fill the trench with storage node capacitor electrode material 17. However, as design rules are reduced below 0.12 $\mu$m, processing of a trench capacitor having an isolation collar sufficiently thick to reduce the parasitic MOSFET leakage current to 1A/cell or less becomes increasingly difficult. Smaller trench openings necessitate a corresponding reduction in isolation collar thickness to facilitate filling of the trench with storage node capacitor electrode material 17. However, to reduce the parasitic leakage to an acceptable level, the thickness of the isolation collar 16 needs to be about 25–70 nm, depending on operating voltage conditions. Such a thick isolation collar hinders the filling of the smaller trench and also increases the series resistance of the storage capacitor within the trench, due to the smaller cross-sectional area of the conductive material 17 confined by isolation collar 16.

Another technique of raising the threshold voltage of the parasitic MOSFET and reducing its off-state leakage is to increase the dopant concentration in the substrate between storage node diffusion 22 and buried-plate diffusion electrode 12. However, raising this dopant concentration increases the electric fields in the depletion regions. This results in a sharp increase in storage node diffusion 22 to substrate 20 leakage current which causes a corresponding decrease in the data retention time. This is especially true when silicon crystallographic defects are present and when the p-well doping concentration adjacent storage node diffusion 22 exceeds approximately $6 \times 10^{17}$ atoms/cm$^3$.

One prior art structure uses a structure and method of forming an annular region of higher dopant concentration localized between the storage node diffusion and the buried-plate diffusion of a trench capacitor DRAM cell. This technique limits the vertical extent of the region of higher dopant concentration such that the substrate doping adjacent the storage node diffusion and, hence, the junction leakage are not significantly increased. However, for the technique to be effective in reducing parasitic MOSFET leakage while avoiding high substrate doping adjacent the storage node diffusion, a minimum separation of approximately 0.8 $\mu$m between storage node diffusion and buried-plate diffusion is required. Accordingly, for a given trench depth, the portion of trench sidewall area containing the capacitor dielectric 15 is reduced. This results in the capacitance of storage capacitor being reduced.

It is desirable to provide a structure and method for a fabricating a trench capacitor with enhanced time of charge retention and an isolation collar which is thinner than other prior art trench capacitor structures.

SUMMARY OF THE INVENTION

From a first apparatus aspect the present invention is a semiconductor apparatus comprising a semiconductor body defining a trench therein and being of a first conductivity type, first and second semiconductor regions, and a trench. The first and second semiconductor regions are of a second conductivity type that is opposite the first conductivity type. The regions are located within the semiconductor body and are separated by a portion of the semiconductor body. Each of the first and second semiconductor regions shares a section thereof which defines portions of a wall of the trench. A part of the portion of the semiconductor body between the first and second semiconductor regions defines a void which extends around the perimeter of the trench. The wall of the trench is lined with an insulating layer that separates the void from the trench and separates the second semiconductor region from the trench. The trench is filled with a conductive material that contacts the section of the first semiconductor region that defines a portion of the wall of the trench.

From a second apparatus aspect the present invention is a transistor-capacitor memory cell comprising a semiconductor body defining a trench therein and being of a first conductivity type, first, second and third regions, and a conductive material. The first, second, and third semiconductor regions are of a second conductivity type that is opposite the first conductivity type. The regions are located within the semiconductor body and are separated by portions of the semiconductor body. The first and second semiconductor regions are first and second input/output regions of the transistor of the memory cell. A gate of the transistor is located between a portion of the semiconductor body between the first and second input/output regions and is separated therefrom by a gate dielectric layer. Each of the second and third semiconductor regions has a section thereof which defines portions of a wall of the trench. A part of the portion of the semiconductor body between the second and third semiconductor regions defines a void which extends around the perimeter of the trench. Portions of the wall of the trench are lined with a first insulating layer that separates the void from the trench and separates the third semiconductor region from the trench. The insulation lined trench is filled with a conductive material that contacts the portion of the second semiconductor region that defines a portion of the wall of the trench. The conducive material, insulating layer, and third semiconductor region serving as the capacitor of the memory cell.

From a third apparatus aspect the present invention is a semiconductor apparatus comprising a semiconductor substrate, a first n+ type conductivity region, a first dielectric layer, a second n+ type conductivity region, a p-type conductivity region, a second dielectric layer, and conductive material. The semiconductor substrate defines a trench therein which has at least one wall. The first n+ type conductivity region abuts the wall of the trench at a lower portion of the trench. The first dielectric layer covers the part of the wall of the trench and is located over the portion of the first n+ type conductivity region. The second n+ type conductivity region abuts at least one of the wall in an upper portion of said trench. The p-type conductivity region is within the semiconductor substrate and is positioned between the first and second n+ type conductivity diffusion regions. The second dielectric layer covers portions of the wall of the trench positioned between the first and second n+ type conductivity diffusion regions. A portion of the p-type conductivity region defines a continuous void therein which intersects the wall of the trench and encircles the perimeter of said trench and is positioned between said first and second n+ type conductivity diffusion regions. A conductive material is disposed within the dielectrically lined trench.

In a first method aspect the present invention is a method, starting with a semiconductor body of a first conductivity type in which there has been formed a trench with a first region of a second conductivity type in contact with a lower portion of a wall of the trench and a first insulating layer covers the wall of the trench. The method comprises the steps of: filling a lower portion of the trench with conductive material; forming an opening in the first insulating layer above the first region and the conductive material such that a portion of the semiconductor body is exposed with said exposed portion being separated from the first region by other portions of the semiconductor body; forming through the opening a void in the semiconductor body, said void encircling the trench; forming a second insulating layer so as to close the opening in the first insulating layer; filling a portion of the trench above the first conductive material with a second conductive material; and forming a second region of a second conductivity type in a portion of the semiconductor body displaced from the void by portions of the semiconductor body, said second region being in contact with the second conductive material.

From a second method aspect the present invention is a method of making a semiconductor structure. The method comprises the steps of: forming in a semiconductor substrate a trench which has a wall defined by a portion of the semiconductor substrate; forming a capacitor in a lower portion of said trench, said capacitor having a first n+ type conductivity diffusion region abutting the wall in a lower portion of said trench, said first n+ type conductivity diffusion region defining a first electrode of said capacitor; forming a node dielectric within said lower portion of said trench, said node dielectric overlying said first n+ type conductivity diffusion region; filling lower portion of said trench with a first conductive material, said first conductive material defining a second electrode of said capacitor; forming an insulating layer over top surface of said first conductive material; forming an etch barrier material on the wall of an upper portion of said trench; removing said insulating layer over the top surface of said first conductive material so as to provide an exposed semiconductor portion of the wall not covered by said etch barrier material, said exposed portion of the wall encircling said trench; etching a void into said exposed semiconductor substrate portion of the wall not covered by said etch barrier material, said void being continuous about the perimeter of said trench; depositing a conformal insulating material on exposed surfaces, said conformal insulating material lining the interior region of said void, wherein said conformal insulating material pinches off the opening to said void; filling upper portion of said trench with a second conductive material, said second conductive material contacting said first conductive material; forming a second n+ type conductivity region abutting the wall in an upper portion of said trench, said second n+ type conductivity region defining one of input/output regions of a field effect transistor; and forming a p-well region in said semiconductor substrate positioned between said first n+ type conductivity region and said second n+ type conductivity region.

The present invention will be better understood from the following more detailed description taken in conjunction with the drawings and claims.

DETAILED DESCRIPTION OF THE INVENTION

Figure 2:
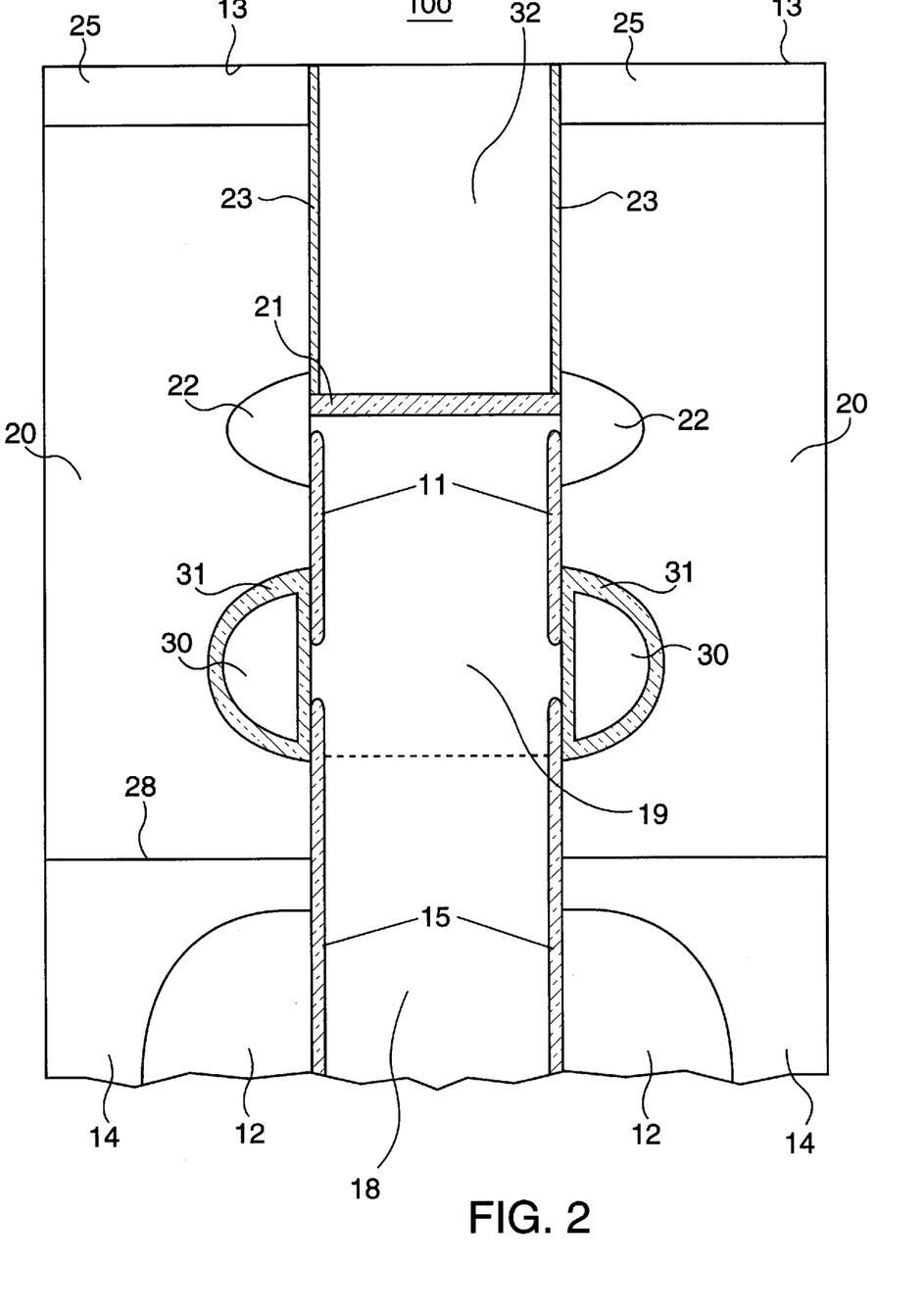
FIG. 2 shows a cross-sectional view of a semiconductor structure (transistor-trench capacitor memory cell) in accordance with the present invention.

Referring now to FIG. 2, there is shown a semiconductor structure 100 in accordance with the present invention. Structure 100 has many similar or identical parts with structure 10 of FIG. 1 and these similar parts have been given the same reference numbers. Structure 100 is essentially a transistor-trench capacitor dynamic random access memory cell comprising a vertical metal-oxide-semiconductor field effect (MOSFET) having a first input/output region 25 (typically denoted as a drain region) which extends from a top surface 13 of a semiconductor body (substrate) 20 into the semiconductor body 20, a second input/output region 22 (typically denoted as a source region), and a conductive gate 32, typically doped polysilicon, which is separated from a vertical surface of the semiconductor body 20 by a gate dielectric layer 23. The shown vertical MOSFET is merely illustrative of one application of the present invention. A lateral MOSFET can be substituted for the vertical MOSFET. The trench capacitor of structure 100 has relatively thin dielectric layers 11 and 15 as compared to the relatively thick collar layer 16 of structure 10 of FIG. 1. A void (opening) 30 in a portion 30 of semiconductor body 20 between source region 22 and n+ type buried-plate diffusion 12 is lined with a dielectric layer 31 which merges with dielectric layers 11 and 15. Void 30 encircles the trench which is filled with conductive materials 18 and 19. The dashed line between conductive materials 18 and 19 indicates that these two material, which can be and are typically of the same composition, are formed at different times in the fabrication process. The dielectrically isolated void 30 decreases capacitor leakage current contributed by a vertical parasitic MOSFET existing between the n+ buried-strap outdiffusion (source region) 22 and the n+ type buried-plate diffusion 12. The void 30 is referred to as a "toroidal void (or TV) collar." Toridal void 30 is believed to reduce vertical parasitic leakage current as compared to the conventional prior art isolation collar structure 16 (see FIG. 1) or from other prior art isolation collar structures which seek to modify the geometry of the trench wall. A lateral MOSFET can be substituted for the vertical MOSFET.

Figure 3:
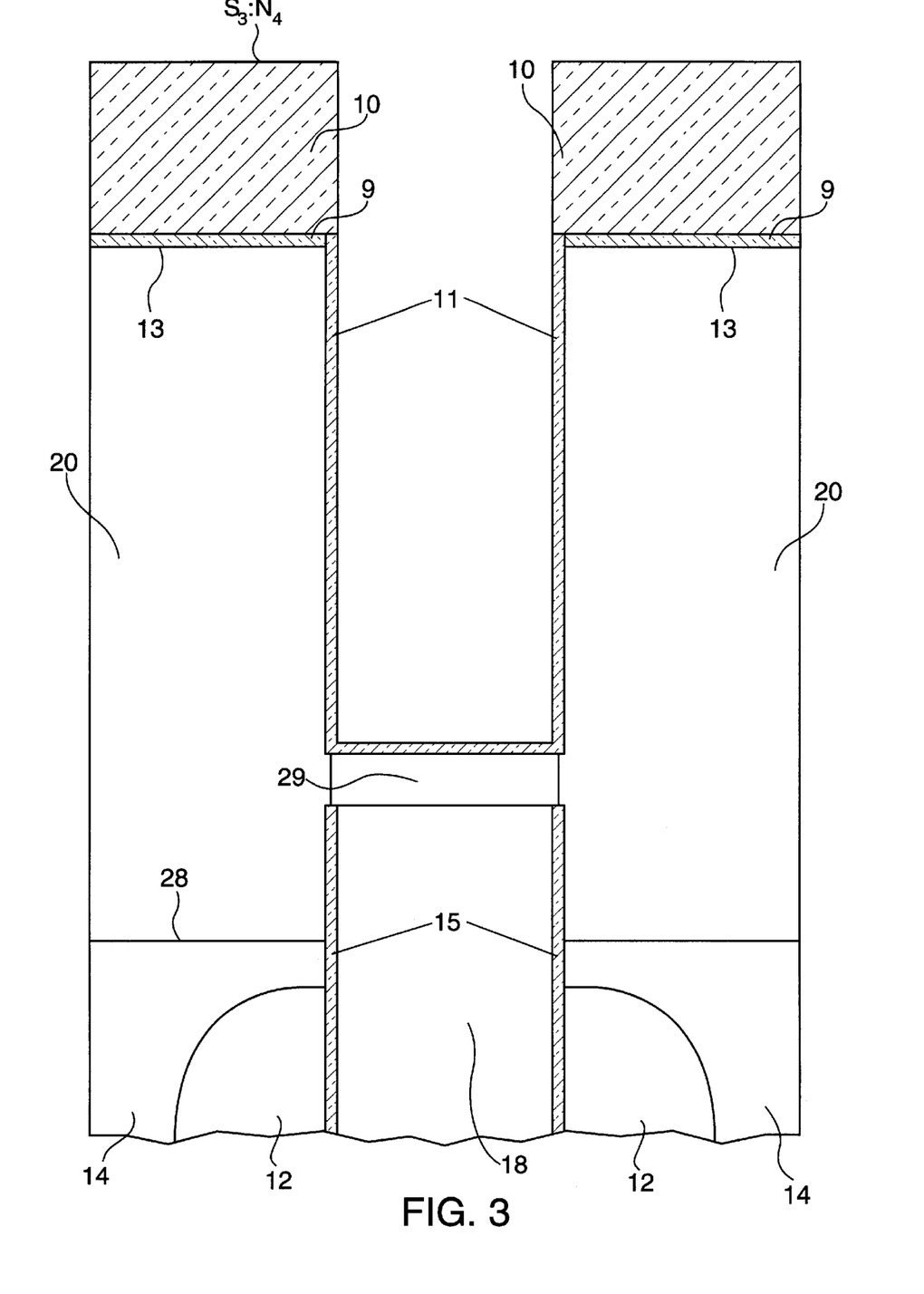
FIGS. 3–8 show various steps in the fabrication of the structure of FIG. 2.

Referring now to FIG. 3, there is shown an intermediate step in the fabrication of structure 100 of FIG. 2. Following formation of the storage capacitor structure in the lower portion of the trench. Standard processing, well known in the art of trench capacitor memory technology is employed through the formation of the storage capacitor region of the trench as shown in FIG. 3. Such a conventional trench capacitor is described in, for example, an article by Nesbit et al., entitled "A 0.6 $\mu m^2$ 256 Mb Trench DRAM Cell With Self-Aligned Buried Strap (BEST)", IEDM Technical Digest, 1993, pp. 627–630, which is herein incorporated by reference for all purposes.

A conventional pad stack typically consists of a thin thermal silicon oxide layer 9 and a deposited silicon nitride layer 10 which is formed on a top surface 13 of the substrate 20. The substrate 20 is preferably a bulk silicon wafer, but can include silicon on insulator (SOI) or other types of materials. The substrate 20, for example, may be lightly or heavily doped with impurities of a pre-determined conductivity type to achieve the desired electrical characteristics. In an exemplary embodiment, the starting substrate material is lightly p-type doped, typically with boron, to a concentration of about 1–2×$10^{16}$ atoms/$cm^3$. An n-type doped region 14 is typically ion implanted such that an n-type region/p-type substrate junction 28 is formed at a predetermined depth below the top surface of the substrate 20, preferably at a depth of 200 nm–1500 nm. Typically, phosphorus or arsenic impurities are implanted such the n-type region 14 contains a peak dopant concentration of $1 \times 10^{17}$–$2 \times 10^{18}$ atoms/cm$^3$. The thickness of silicon oxide layer 9 ranges from 2–20 nm. The silicon nitride layer 10 is preferably deposited to a thickness of 100–500 nm using well known techniques, such as chemical vapor deposition (CVD). Using conventional lithographic techniques, a hard mask is patterned over the layers 9 and 10 and then etched open to the top surface 13 of the substrate 20. Trenches are etched into the substrate 20 to a depth ranging between approximately 1 mm and 10 mm using well known methods such as reactive ion etching (RIE). The hard mask is eroded by the trench etching process and then completely removed selective to silicon and silicon nitride following completion of the trench etch, using well known etching methods. The n-type region 14 may be formed either before or after the trench etch, since the point in the process at which it is formed is not critical.

An n+ type conductivity buried-plate diffusion region 12 is formed in a portion of region 14 and forms a part of a wall of the trench. This can be done, for example, by providing a dopant source and outdiffusing dopants into the substrate 20. Various methods of forming an n+ buried-plate diffusion region 12 are well known in the art and may comprise forming a diffusion barrier on the walls in the upper part of the trench and exposing the silicon walls in the lower portion of the trench to a diffusion source. The n-type dopant may typically be obtained from a solid source, such as arsenic silicate glass (ASG), or from a gaseous source. Such techniques are described in, for example, in an article by Nesbit et al., entitled "A 0.6 $\mu$mm$^2$ 256 Mb Trench DRAM Cell With Self-Aligned Buried Strap (BEST)", IEDM Technical Digest, 1993, pp. 627–630, which is already incorporated by reference.

After removal of the diffusion source and diffusion barrier, a dielectric layer 15 is formed on the walls of the trench. The dielectric layer 15 serves as the insulator of the storage capacitor, between the buried-plate diffusion 12, which serves as a first electrode of the capacitor, and a second electrode of the capacitor to be subsequently formed. The dielectric layer 15 is preferably formed to an equivalent silicon oxide thickness of 25–40 Angstroms, and may typically comprise a layered structure such as silicon nitride, formed by nitridation of the silicon surface or other techniques, covered by silicon oxide. The layer 15 is typically formed by oxidation of the pre-existing nitride layer. The use of the composite nitride/oxide layer improves the reliability of the capacitor dielectric. Trench capacitors having alternative geometry and method may be substituted for the above without loss of relevance to the present invention. For example, a structure and method for a bottle shaped trench capacitor is described in U.S. Pat. No. 6,018,174, the disclosure of which is incorporated herein by reference.

Conductive material 18, preferably heavily n-type conductivity doped polysilicon, is deposited such that it fills the trench. The conductive material is deposited by well known techniques, such as CVD and planarized to a top surface of silicon nitride layer 10. Preferably using an anisotropic etch, the conductive material 18 is then recessed to the desired depth of the toroidal void 30 (see FIG. 2) to be subsequently formed. The storage capacitor node electrode consists of conductive material 18 and subsequently deposited conductive material 19 (see FIG. 2).

A layer of high-density plasma (HDP) oxide is then deposited on all exposed surfaces. The directional deposition of the HDP oxide results in an oxide which is substantially thicker on horizontal surfaces than on vertically oriented surfaces (by typically a 5–10:1 ratio, depending on deposition conditions). An isotropic oxide etch is then optionally used to remove any deposited oxide from vertical surfaces. Then, using well known resist recess methods, the deposited oxide is removed from the top surface of nitride pad layer 10, leaving HDP oxide layer 29 on the top surface of conductive material 18. The thickness of HDP oxide layer 29 determines the height of the toroidal void to be subsequently formed. The preferred thickness of HDP layer 29 is between 10 and 30 nm. A silicon nitride layer 11 is then is conformally deposited, using CVD, to a thickness ranging from 2–10 nm. Silicon nitride layer 11 serves as an etch barrier during a subsequent silicon etch which is used to form the toroidal void.

Figure 4:
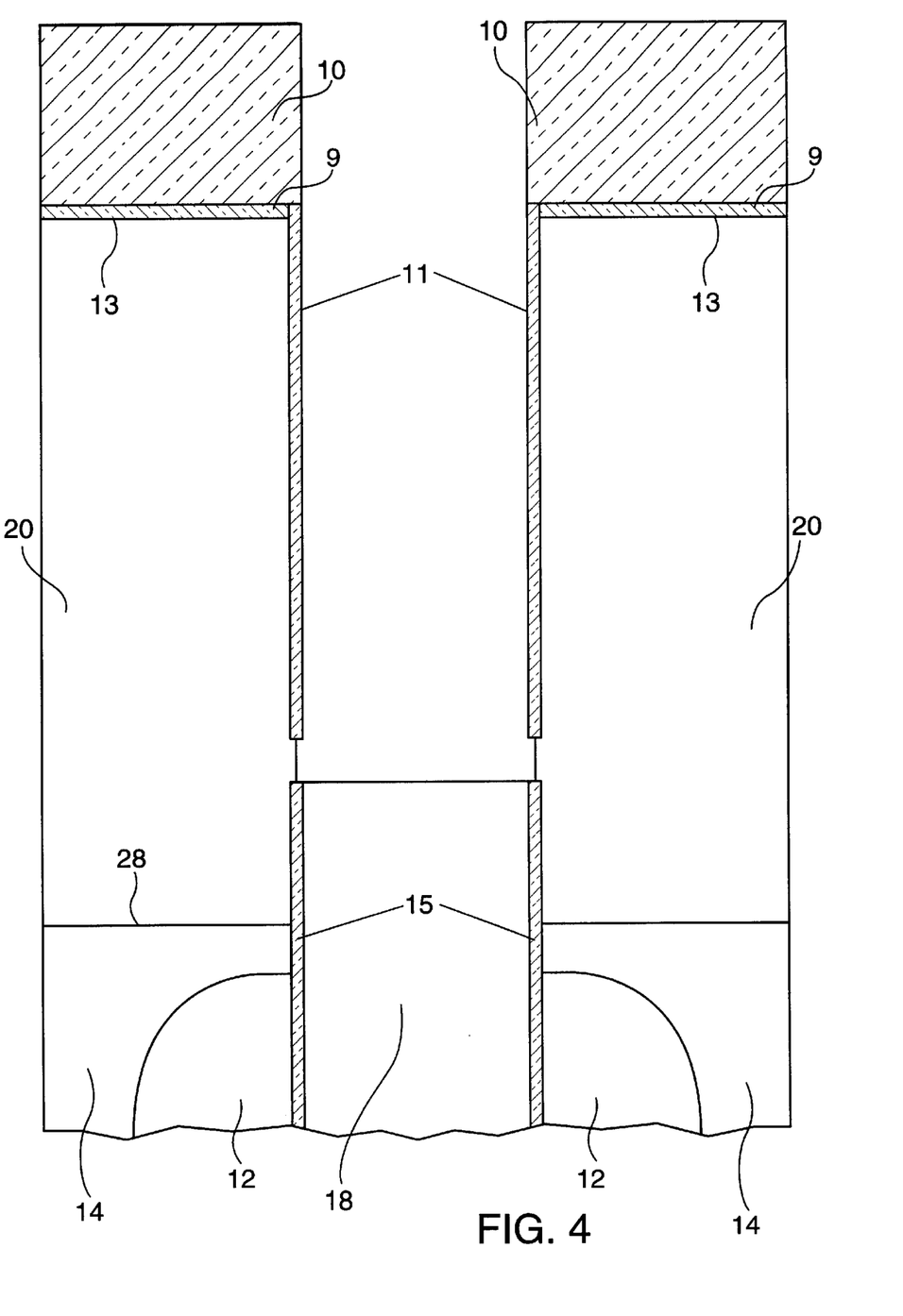

FIG. 4 shows a continuation of the fabrication process in which a directional [i.e., Reactive Ion Etch (RIE)] silicon nitride etch is then applied to open the horizontally disposed portion of silicon nitride layer 11 overlying HDP oxide layer 29. An oxide etch selective to silicon and silicon nitride, preferably anisotropic, is then used to completely remove HDP oxide layer 29, exposing the silicon on the portion of the walls not protected by silicon nitride layer 11. It is preferred that the oxide etch be anisotropic to minimize the amount of undercut at the edge of pad oxide layer 9.

Figure 5:
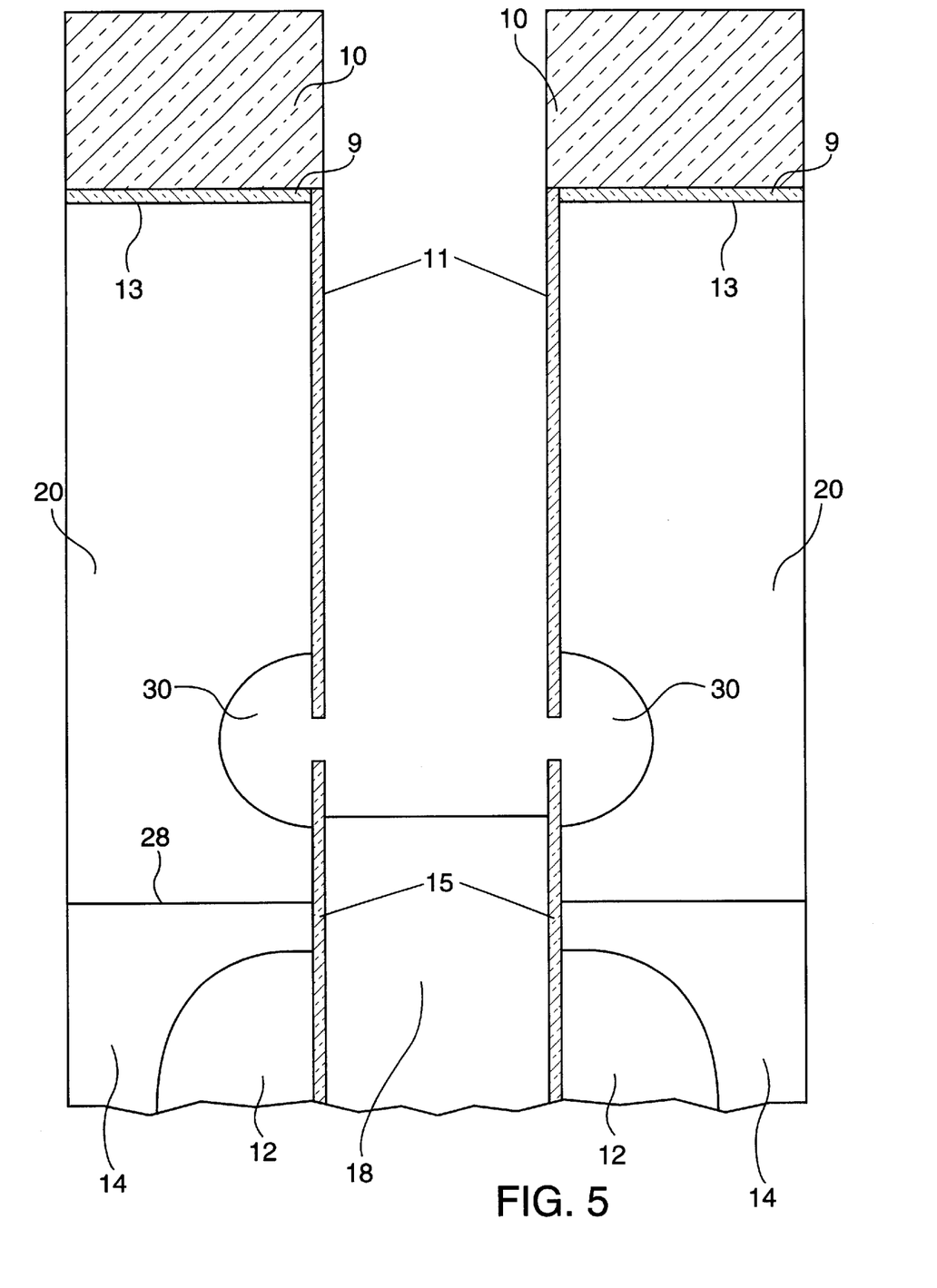

Referring now to FIG. 5, the exposed silicon on the walls of the trench, not covered by protective barrier layer 11 or by node dielectric layer 15, is etched selective to nitride and oxide. It is preferred that an isotropic etch such as a chemical downstream etch (CDE) be used, although other etchants may also be employed solely or in combination. For example, either isotropic or crystallographic wet etchants may also be employed. The silicon etch undercuts protective barrier layer 11 and node dielectric layer 15, forming void 30 in the trench walls around the entire perimeter of the trench. The etch conditions (time, temperature, pressure and etchant composition) are adjusted with methods well known in the art such that the depth of the void into the substrate is preferably 20–40 nm. The etch process may also recess the top surface of conductive material 18, as shown in FIG. 5.

Figure 6:
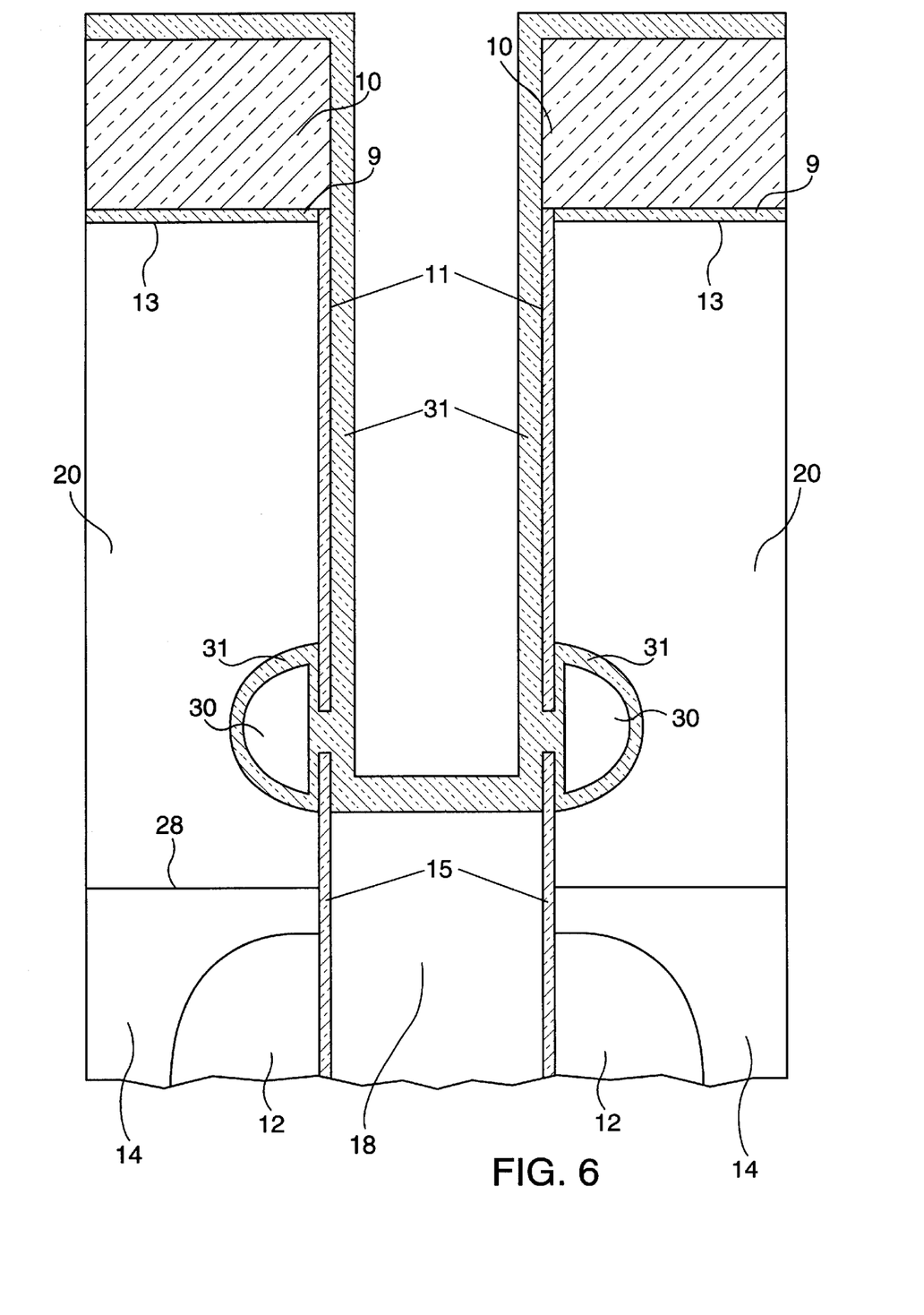

Referring to FIG. 6, a conformal oxide layer 31 is deposited by CVD over the exposed surfaces. During the oxide deposition process, a layer of oxide 31 is formed in the interior of void 30, in addition to the vertical surface of barrier layer 11 on the walls of the trench. As the thickness of oxide layer 31 increases during the deposition process, the opening to the interior of void 30, defined by the gap between barrier layer 11 and node dielectric layer 15, pinches off. A sealed void 30 is thus formed. Continued deposition of the oxide builds up the thickness of the oxide formed on the vertical surface of barrier layer 11, but not in void 30. Therefore, the thickness of oxide layer 31 lining void 30 is limited by the pinching off of the opening. The thickness of oxide layer 31 lining void 30 is typically limited to 5–15 nm, whereas the deposited thickness of the oxide on the surface of barrier layer 11 is preferably 20–40 nm. The aforementioned preferred specification for the thickness of HDP layer 29 (10–30 nm), the etched depth of void 30 (20–40 nm), and the thickness of oxide layer 31 lining void 30 (5–15 nm) yields a preferred range for the height of the sealed void formed in the interior of void 30 of between 40 and 80 nm.

Figure 7:
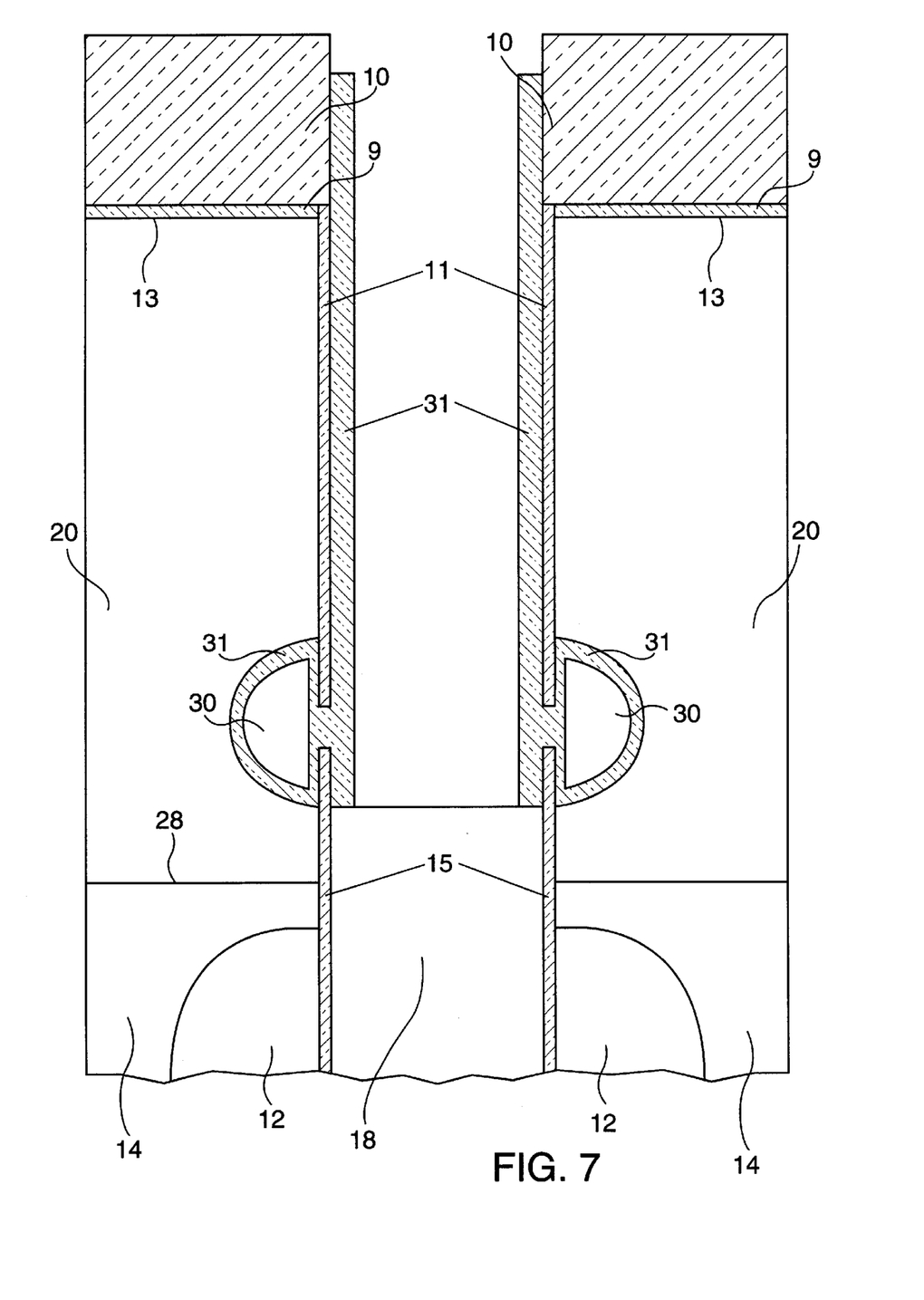
Figure 8:
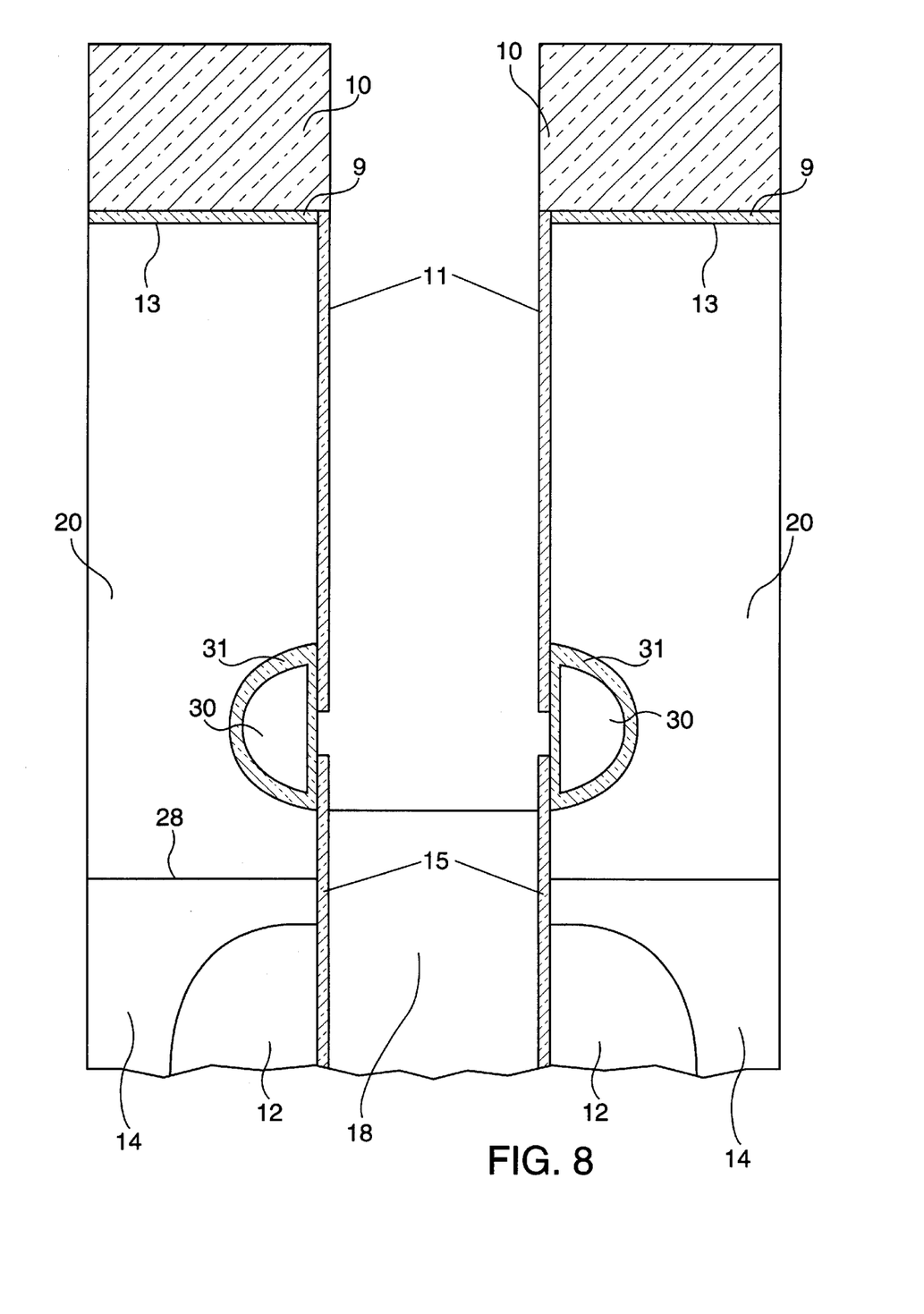

Turning now to FIG. 7, an oxide RIE is used to remove horizontal portions of the oxide layer 31 from the top surface of conductive material 18 so as to expose a portion thereof while still leaving portions of the layer 31 on the upper sidewalls of layer 15. In an alternate embodiment, oxide layer 31 may be partially or completely removed from the vertical surface of barrier layer 11, as shown in FIG. 8. It is later demonstrated in this specification that only a very minimal thickness oxide layer 31 is required over barrier layer 11 to suppress vertical parasitic MOSFET leakage to an acceptable level. In most electrical operating condition situations the thickness of oxide layer 31 over barrier layer 11 need be 0–20 nm. This isolation collar thickness is significantly less than what is required in prior art structures, facilitating the filling of the trench and reducing its series resistance.

Processing of the memory cell now continues in a manner customarily practiced in the art. Referring back to FIG. 2, the present invention is shown following completion of gate conductor 32. Following the exposure of the top surface of first conductive trench fill material 18, as shown in FIGS. 7 and 8, a second conductive trench fill material 19 is deposited to completely fill the trench. As with first conductive trench fill material 18, second conductive trench fill material 19 may be n+ doped polysilicon or other suitable conductive material. Second conductive trench fill material 19 is planarized to the top surface of pad nitride layer 10 and then recessed to a predetermined depth which will define the channel length of the vertical access MOSFET. The top surface of conductive material 19 is preferably recessed 200–500 nm beneath the top surface of substrate 20. Then, using well known methods, a buried-strap and buried-strap outdiffusion 22 is formed. One such method of forming buried-strap outdiffusion 22 involves removing any exposed isolation collar 31 and barrier layer 11 selective to silicon from above the top surface of conductive material 19, forming a placeholder layer of HDP oxide over the top surface of conductive material 19, forming nitride spacers on the exposed walls of the trench, removing placeholder HDP oxide over the top surface of conductive material 19 to expose a portion of the trench walls not protected by the nitride spacers, depositing a doped polysilicon diffusion source in the trench, recessing the doped polysilicon diffusion source to a depth approximately level with the bottom of the nitride spacers, and performing a thermal process to drive the dopant from the polysilicon diffusion source into the substrate. Buried-strap outdiffusion 22 defines one source-drain diffusion of the vertical access MOSFET of the memory cell.

Exposed protective nitride spacer material on the walls of the trench is then removed with a nitride etch which is selective to oxide and silicon. A sacrificial thermal oxidation of silicon is then done to clean up (i.e., remove etch damage) the trench walls. Insulating layer 21, preferably comprised of HDP oxide, is formed by a process which is similar to the process previously described for formation of HDP oxide layer 29. Insulative layer 21 is commonly known as the trench top oxide (TTO) which serves to insulate conductive material 19 of the storage capacitor node from overlying gate conductor 32. During formation of insulative layer 21, the sacrificial oxide is also removed from under any HDP oxide extant on the walls. A gate dielectric 23 for the vertical access MOSFET is then formed, which may consist of a thermal oxide, an oxynitride or a deposited dielectric. Then gate conductor material, preferably n+ doped polysilicon is deposited, filling the aperture above insulative layer 21, and planarized. At this point in the process, pad nitride layer 10 is removed selective to oxide and silicon. Ion implantations are then used to define the channel doping profile for the vertical access MOSFET and doping elsewhere in the array p-well 20, and to form bitline diffusion regions 25. Preferably p-type dopant, such as boron, is used to define the doping profile of the p-well above junction 28, defined by n-band 14 and p-well 20. N-type dopant, such as phosphorus or arsenic, is used for the bitline diffusion regions 25. N-type bitline diffusion 25 and n-type buried-strap outdiffusion 22 define the source-drain diffusions of the vertical access NMOSFET.

Following processing of the memory array, as described above, standard processing is followed to completion of the semiconductor structure 100, which includes formation of isolation regions, complimentary p and n-type wells containing CMOS (N-channel MOSFETs and P-channel MOSFETs) support circuitry, and various interconnect and insulation layers. As is typical in state of the art memory technologies, shallow trench isolation is preferred because of inherent density advantages. Additional lithographic steps are required to pattern the isolation regions, the support wells, and various interconnect layers. Distinct interconnect layers are used to define the wordlines and bitlines in the memory array, and the gate wiring in the support circuitry. Additional wiring levels are used to facilitate the interconnection of the circuit elements on the chip. Insulation layers are used for passivating the chip.

The preferred location of the TV collar 30 relative to the peak of the p-well impurity concentration doping profile is not readily apparent. Since an objective of the present invention is to reduce the thickness of the isolation collar while limiting the vertical parasitic leakage current to less than 1fA/cell, knowledge of the preferred location of the TV collar (void) 30 relative to the location of peak of the p-well is important.

Figure 9:
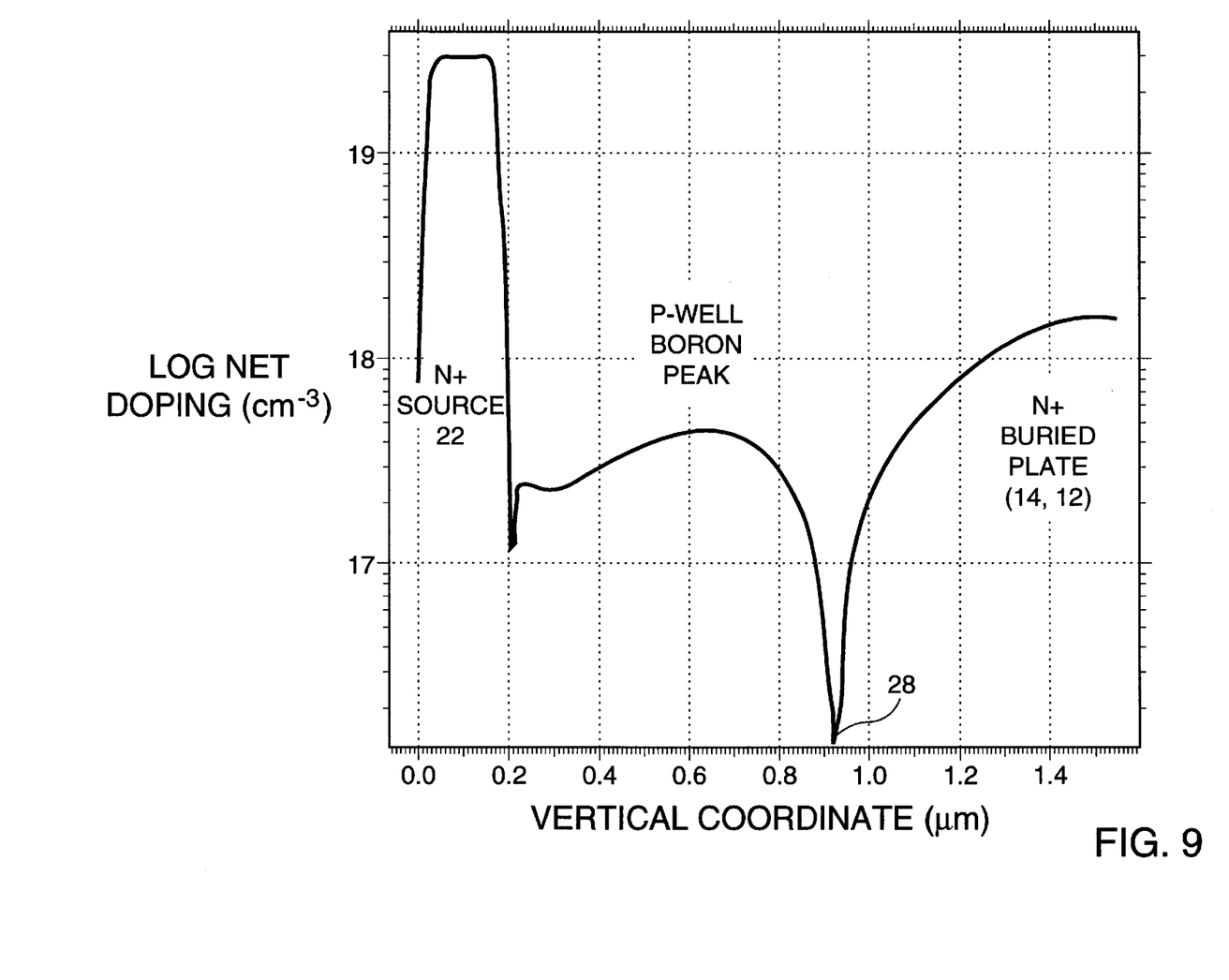
FIG. 9 shows a graph illustrating a modeled vertical doping profile in a portion of a structure formed according to an embodiment of the invention.

Referring now to FIG. 9, there is shown a graph of a computer simulated vertical doping profile through the parasitic MOSFET in accordance with an embodiment of the present invention. The x-axis represents the vertical distance ($\mu$m) downward from the top of the n+ type conductivity buried-strap outdiffusion 22. The y-axis represents the Log of net Doping ($cm^{-3}$). This doping profile is of interest since it represents the channel doping and source-drain diffusions of the vertical parasitic MOSFET. As stated earlier, the p-well doping concentration must be used judiciously as a means of reducing the vertical parasitic MOSFET leakage, since storage node diffusion (i.e., n+ type conductivity buried-strap outdiffusion) leakage is sensitive to the adjacent p-type well doping concentration. Additionally, the depth of the p-type well implant between n+ buried-strap outdiffusion 22 and n+ buried-plate 12 regions requires a boron implant energy ranging from 300–350 keV, resulting in significant straggle of the profile. The straggle is an important factor determining the spacing required between n+ buried-strap outdiffusion 22 and n+ buried-plate regions 22 and 12, respectively. Therefore, it is desired to locate the peak of the p-type well profile sufficiently far from the buried-strap outdiffusion 22. Taking the above factors into consideration, the exemplary case shown in FIG. 9 has a 0.7 $\mu$m spacing between n+ buried-strap outdiffusion region 22 and n+ type conductivity buried-plate region 12, with the peak of the p-type well profile approximately 0.3 $\mu$m above the junction between p-type well and n+ type conductivity buried-plate diffusion.

Figure 10:
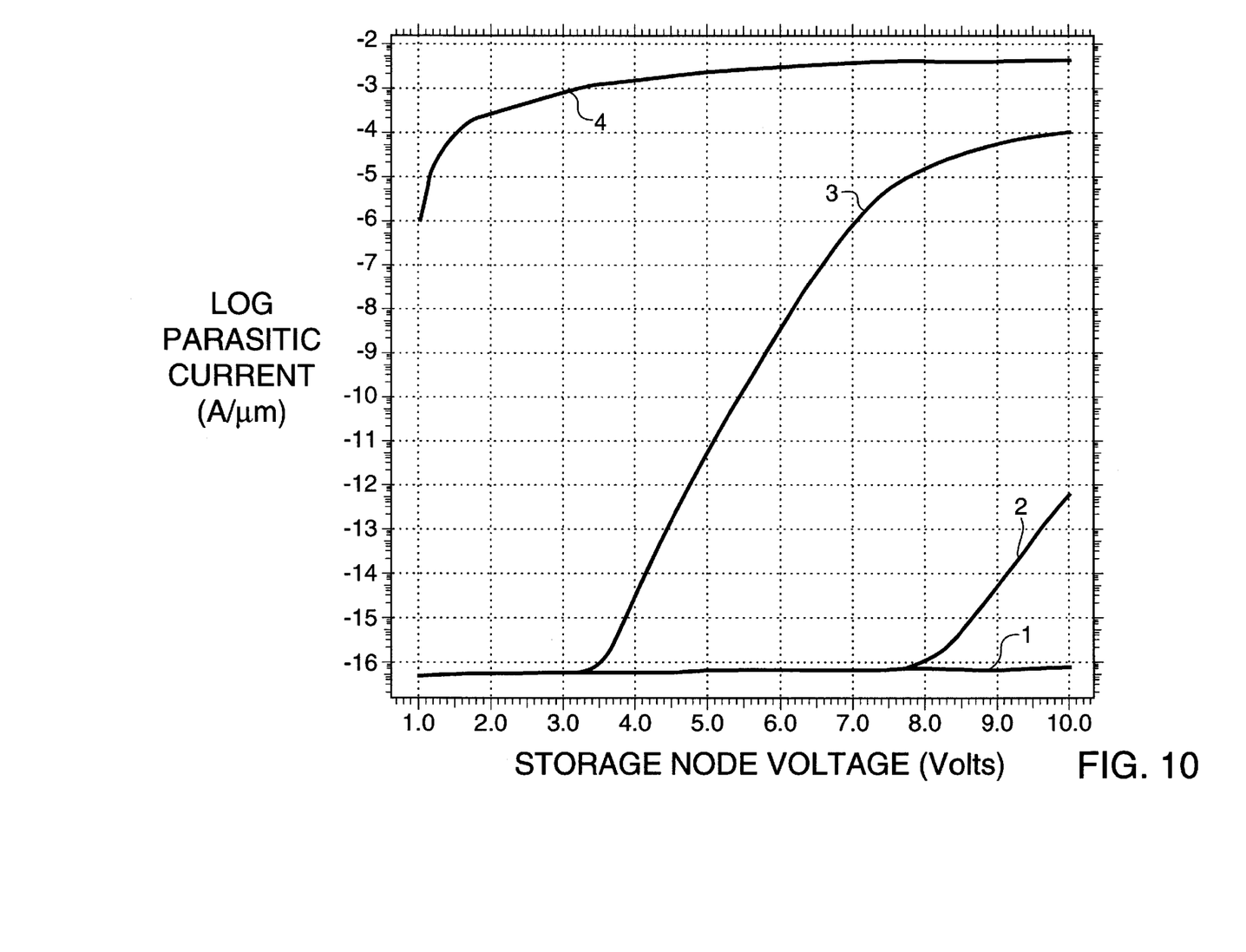
FIG. 10 shows a graph illustrating modeled parasitic leakage current, comparing various structures formed according to an embodiment of the invention with a prior art structure.

Referring now to FIG. 10, from the above described simulation there is graphically shown simulated electrical conduction characteristics (see curves 1, 2, and 3) of the vertical parasitic MOSFET structure 100 of FIG. 2 containing a void 30 in accordance with an embodiment of the invention for various locations of the void 30 located in the semiconductor body 20 below region 22. Additionally, curve 4 corresponds to a prior art structure containing no void 30. The graph has a yaxis with the Log of Parasitic Current (A/μm) and an x-axis with Storage Node Voltage (Volts). Curve 1 illustrates the parasitic current characteristic with the void 30 located at the P-well peak impurity concentration; curve 2 illustrates the parasitic current characteristic with the void 30 located 100 nm below the P-well peak impurity concentration; curve 3 illustrates the parasitic current characteristic with the void 30 located 200 nm below the P-well peak impurity concentration; and curve 4 illustrates the parasitic current characteristic with a void not present (i.e., a prior art structure). For all cases in FIG. 10, the structures used a 3.5 nm layer of silicon nitride on the trench wall between the n+ type conductivity buried-strap outdiffusion region 22 and the n+ type conductivity buried-plate region 12. It is apparent from the simulated results of FIG. 10 that, for best suppression of vertical parasitic MOSFET conduction, the center of the void 30 is preferred to be approximately coincident with the peak of the p-well impurity concentration profile (shown in FIG. 9).

It is also apparent that the void 30 is still very effective in suppressing vertical parasitic MOSFET conduction even when the void is offset from the p-well peak impurity concentration by 200 nm. For typical operating conditions, the vertical parasitic leakage current must not exceed approximately 1fA/cell at a storage node voltage of 1.5V. For the case of no void 30, essentially no suppression of vertical parasitic MOSFET leakage is obtained.

The foregoing description of the invention illustrates and describes the basic principles of the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments. For example, the basic structure of a semiconductor body with a trench having an insulator liner and conductive fill and first and second regions of a first conductivity type separated from each other by a third region of the opposite conductivity type with a void in the third region can be used as part of a lateral field effect transistor-trench capacitor memory cell.

What is claimed is:

1. Semiconductor apparatus comprising:
   a semiconductor body defining a trench therein and being of a first conductivity type;
   first and second semiconductor regions of a second conductivity type that is opposite the first conductivity type, said regions being located within the semiconductor body and being separated by a portion of the semiconductor body;
   each of the first and second semiconductor regions having a section thereof which defines portions of a wall of the trench;
   a part of the portion of the semiconductor body between the first and second semiconductor regions defining a void which extends around the perimeter of the trench;
   the wall of the trench being lined with an insulating layer that separates the void from the trench and separates the second semiconductor region from the trench; and
   the trench being filled with a conductive material that contacts the section of the first semiconductor region that defines a portion of the wall of the trench.

2. The semiconductor body of claim 1 further comprising a second insulating layer which lines the portions of the semiconductor body that define the void.

3. The semiconductor body of claim 1 wherein the void is located near the position in the portion of the semiconductor body between the first and second semiconductor regions where the peak in impurity concentration of this portion exists.

4. The semiconductor body of claim 1 wherein the void is located at the position in the portion of the semiconductor body between the first and second semiconductor regions where the peak in impurity concentration of this portion exists.

5. A transistor-capacitor memory cell comprising:
   a semiconductor body defining a trench therein and being of a first conductivity type;
   first, second, and third semiconductor regions of a second conductivity type that is opposite the first conductivity type, said regions being located within the semiconductor body and being separated by portions of the semiconductor body;
   the first and second semiconductor regions being first and second input/output regions of the transistor of the memory cell;
   a gate of the transistor being located between a portion of the semiconductor body between the first and second input/output regions and being separated therefrom by a gate dielectric layer;
   each of the second and third semiconductor regions having a section thereof which defines portions of a wall of the trench;
   a part of the portion of the semiconductor body between the second and third semiconductor regions defining a void which extends around the perimeter of the trench;
   portions of the wall of the trench being lined with a first insulating layer that separates the void from the trench and separates the third semiconductor region from the trench;
   the insulation lined trench being filled with a conductive material that contacts the portion of the second semiconductor region that defines a portion of the wall of the trench; and
   the conducive material, insulating layer, and third semiconductor region serving as the capacitor of the memory cell.

6. The transistor-capacitor memory cell of claim 5 further comprising a second insulating layer which lines the portions of the semiconductor body that define the void.

7. The transistor-capacitor memory cell of claim 5 wherein the void is located near the position in the portion of the semiconductor body between the second and third semiconductor regions where the peak in impurity concentration of this portion exists.

8. The transistor-capacitor memory cell of claim 5 wherein the void is located at the position in the portion of the semiconductor body between the second and third semiconductor regions where the peak in impurity concentration of this portion exists.

9. Semiconductor apparatus comprising:

a semiconductor substrate;

the semiconductor substrate defining a trench therein which has at least one wall;

a first n+ type conductivity region abutting the wall of the trench at a lower portion of said trench;

a first dielectric layer covering the part of the wall of said trench and being located over the portion of the first n+ type conductivity region;

a second n+ type conductivity region abutting at least one of the wall in an upper portion of said trench;

a p-type conductivity region within said semiconductor substrate positioned between said first and second n+ type conductivity diffusion regions;

a second dielectric layer covering portions of the wall of said trench positioned between said first and second n+ type conductivity diffusion regions;

a portion of the p-type conductivity region defining a continuous void therein which intersects the wall of the trench and encircles the perimeter of said trench and is positioned between said first and second n+ type conductivity diffusion regions; and a conductive material disposed within said dielectrically lined trench.

10. The semiconductor structure of claim 9 wherein said first n+ type conductivity diffusion region is a first electrode of a capacitor and walls of the portion of the semiconductor substrate which define the void are lined with a third dielectric layer.

11. The semiconductor structure of claim 9 wherein said first dielectric layer is the insulator of a capacitor.

12. The semiconductor structure of claim 9 wherein said second n+ diffusion region is an input/output region of a field effect transistor.

13. The semiconductor structure of claim 9 wherein said p-type doped region is a p-well of a memory array.

14. The semiconductor structure of claim 9 wherein said conductive material disposed within said trench is a second electrode of a capacitor.

15. The semiconductor structure of claim 14 wherein said second electrode of the capacitor is n+ type conductivity polysilicon.

16. The semiconductor structure of claim 9 wherein said void is less than about 50 nm in depth from a surface of said semiconductor substrate.

17. The semiconductor structure of claim 16 wherein said void is between about 20 and 40 nm in depth from a surface of said semiconductor substrate.

18. The semiconductor structure of claim 9 wherein said dielectric material lining said void is between about 5nm and 15 nm thick.

19. The semiconductor structure of claim 9 wherein said void about 100 nm or less in height.

20. The semiconductor structure of claim 9 wherein said void is between about 40 nm and 80 nm in height.

21. The semiconductor structure of claim 9 wherein said first and second n+ type conductivity diffusion regions are vertically separated by less than about 1 $\mu$m.

22. The semiconductor structure of claim 13 wherein a peak of impurity concentration of said p-well is positioned about 300 nm above said first n+ type conductivity diffusion region.

23. The semiconductor structure of claim 22 wherein said void is positioned about at the depth of said peak of the impurity concentration of said p-well.

24. The semiconductor structure of claim 23 wherein said void is positioned within about 200 nm of said peak of the impurity concentration of said p-well.

* * * * *